(12) United States Patent
Lee et al.

(10) Patent No.: US 10,580,350 B2
(45) Date of Patent: Mar. 3, 2020

(54) MICRO LIGHT EMITTING DIODE MODULE AND MANUFACTURING METHOD THEREOF

(71) Applicant: UNIFLEX Technology Inc., Taichung (TW)

(72) Inventors: Yuan-Chih Lee, Taichung (TW); Chia-Ming Li, Taichung (TW)

(73) Assignee: Uniflex Technology Inc., Taichung (TW)

( * ) Notice: Subject to any disclaimer, the term of this patent is extended or adjusted under 35 U.S.C. 154(b) by 0 days.

(21) Appl. No.: 15/951,548

(22) Filed: Apr. 12, 2018

(65) Prior Publication Data

US 2019/0251894 A1  Aug. 15, 2019

(30) Foreign Application Priority Data

Feb. 14, 2018 (TW) .............................. 107105457 A (51) Int. Cl.
| | | |
|---|---|---|
| *G09G 3/32* | (2016.01) | |
| *H01L 25/075* | (2006.01) | |
| *H05B 33/08* | (2020.01) | |
| *H01L 33/52* | (2010.01) | |

(52) U.S. Cl.
CPC ............. *G09G 3/32* (2013.01); *H01L 25/075* (2013.01); *H01L 33/52* (2013.01); *H05B 33/0803* (2013.01)

(58) Field of Classification Search
CPC ....... H01L 33/52; H05B 33/0803; G09G 3/32
See application file for complete search history.

(56) References Cited

U.S. PATENT DOCUMENTS

| | | | | |
|---|---|---|---|---|
| 2013/0062630 A1* | 3/2013 | Gowda | ............... | H01L 25/0753 257/88 |
| 2014/0264268 A1* | 9/2014 | Tseng | .................... | H01L 33/505 257/13 |
| 2014/0312368 A1* | 10/2014 | Lee | ..................... | H01L 21/6835 257/89 |
| 2016/0057833 A1* | 2/2016 | Oh | ......................... | H05B 33/22 362/235 |
| 2016/0064334 A1* | 3/2016 | Bishop | ................. | H01L 23/544 438/15 |
| 2017/0345801 A1* | 11/2017 | Lin | ..................... | H01L 25/0753 |

\* cited by examiner

*Primary Examiner* — Mark W Tornow
(74) *Attorney, Agent, or Firm* — Muncy, Geissler, Olds & Lowe, P.C.

(57) ABSTRACT

A micro light emitting diode module contains: multiple flip-chip LEDs and a dielectric layer. The multiple flip-chip LEDs are arranged side by side. The flip-chip LEDs have a light emitting side and an electrical connecting side. The electrical connecting side of the flip-chip LEDs has a p-contact pad and an n pad. The dielectric layer is formed on the electrical connecting side of the flip-chip LEDs. The dielectric layer has multiple electric channels in which multiple electrical circuits are formed. The electrical circuits are corresponded to the p-contact pads and the n-contact pads of the flip-chip LEDs respectively, and each electrical circuit is electrically connected to its corresponding p-contact pad or n-contact pad. By reconstruction of circuits on LED array, the present invention not only has high processing yield, but also significantly reduces the manufacturing time. A method for making the micro light emitting diode module is also provided.

1 Claim, 13 Drawing Sheets

MICRO LIGHT EMITTING DIODE MODULE AND MANUFACTURING METHOD THEREOF

FIELD OF THE INVENTION

The present invention relates to a micro light emitting diode module and a manufacturing method thereof which is applicable for a flat panel display.

BACKGROUND OF THE INVENTION

Conventional flat panel displays includes liquid-crystal display (LCD) and organic light-emitting diode (OLED) display. The LCD controls light rate of each pixel by way of electric currents, thus inevitably leaking some light rays and reducing color contrast and chroma. On the other hand, each pixel of OLED display has self-luminous and thus has enhanced color contrast and chroma.

To overcome the above-mentioned problem of LCDs, an improved micro light emitting diode (Micro LED) module has been developed with a backlight module having a plurality of LED pixels, thus decreasing light leakage and enhancing color contrast and chroma. In addition, the micro LED module can be provided with self-luminous RGB LEDs and is thus applicable for LED displays.

To manufacture the micro LED, mass transfer of LED chips is required. That is, multiple LED chips are batch transferred to a predetermined circuit board. The conventional mass transfer is exemplarily shown in FIGS. 21 to 25, wherein an integrated circuit (IC) board 1 is prepared, solder paste 3 is printed on a plurality of contact pads 2 of the IC board 1, a carrier 5 is provided to carry multiple LED chips 4 in a manner that p-contact pads 6a and n-contact pads 6b of the multiple LED chips 4 correspond to the multiple contact pads 2 of the IC board 1 respectively, and then the solder paste 3 is melted to electrically connect the p-contact pads 6a and the n-contact pads 6b with the multiple contact pads 2 of the IC board 1.

Nevertheless, a precision mass transfer of the LED chips is extremely difficult, especially when the LED chips are to be further miniaturized. The equipment cost is thus high, and the yield rate can be hard to improve. Besides, transferring only a few LED chips at one time can result to prolonged production time.

The present invention has arisen to mitigate and/or obviate the afore-described disadvantages.

SUMMARY OF THE INVENTION

The primary aspect of the present invention is to provide a micro light emitting diode module and a manufacturing method thereof which do not transfer LED chips to a predetermined circuit board.

To achieve the above aspects, a micro light emitting diode module is provided, which includes multiple flip-chip LEDs and a dielectric layer.

The multiple flip-chip LEDs are arranged side by side. Each of the multiple flip-chip LEDs has a light emitting side and an electrical connecting side. The electrical connecting side of the flip-chip LEDs is formed with a p-contact pad and an n pad.

The dielectric layer is formed on the electrical connecting side of each flip-chip LED. The dielectric layer has multiple electric channels in which multiple electrical circuits are formed and corresponded to the p-contact pads and the n-contact pads of the flip-chip LEDs respectively. Each electrical circuit is electrically connected with its corresponding p-contact pad or the n-contact pad.

To achieve the above aspects, a method of manufacturing a micro light emitting diode module is provided, which includes the steps of:

arranging multiple flip-chip LEDs side by side, wherein each of the multiple flip-chip LEDs has a light emitting side and an electrical connecting side, the electrical connecting side of each flip-chip LED is formed with a p-contact pad and an n pad;

forming a dielectric layer on the electrical connecting side of the flip-chip LEDs;

forming multiple electric channels in the dielectric layer; and forming multiple electrical circuits in the multiple electric channels in a manner that the multiple electrical circuits are corresponded to the p-contacts pad and the n-contact pads of the flip-chip LEDs respectively, and each electrical circuit is electrically connected with its corresponding p-contact pad or n-contact pad.

Thereby, mass transfer of LED arrays to a predetermined circuit board is not required in the present invention. On the contrary, electrical circuits are formed on the LED arrays so as to enhance processing yield and to reduce manufacture equipment cost.

DETAILED DESCRIPTION OF THE PREFERRED EMBODIMENTS

Figure 1:
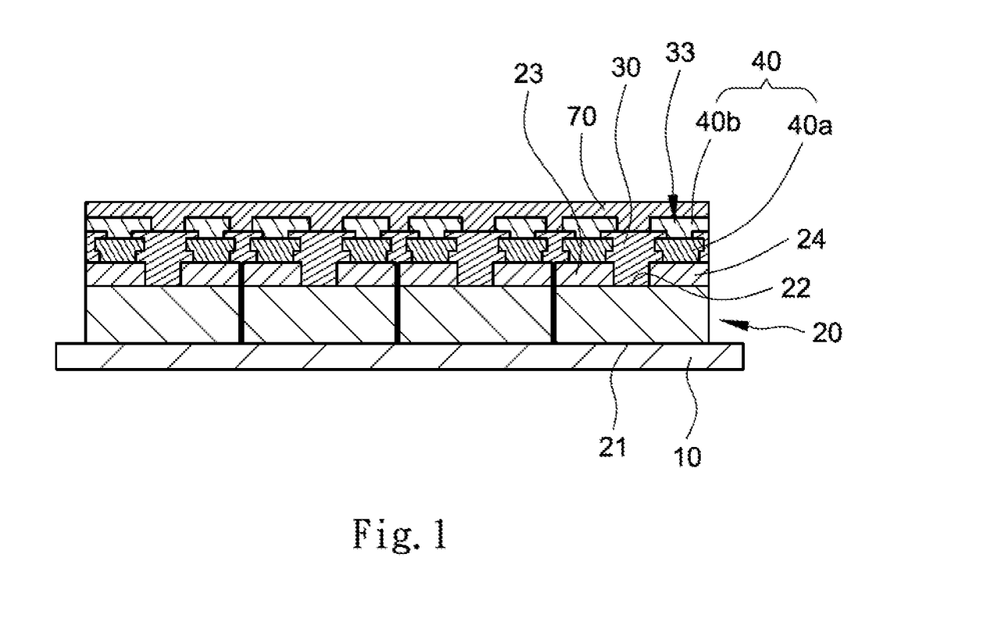
FIG. 1 is a cross sectional view showing the assembly of a micro light emitting diode module according to an embodiment of the present invention.

FIG. 1 is a cross sectional view showing a micro light emitting diode module according to an embodiment of the present invention. The micro light emitting diode module includes multiple flip-chip LEDs 20 arranged side by side, a dielectric layer 30, multiple electrical circuits 40 formed in the dielectric layer 30, and a solder mask layer 70. The flip-chip LEDs 20 can emit the same color (such as white light) so as to be applicable for a backlight module of a liquid-crystal display (LCD). Alternatively, the micro light emitting diode module may include multiple flip-chip LEDs 20 which emit three primary colors (or further including yellow light) so as to be adapted for micro light emitting diode display.

The flip-chip LEDs 20 are arranged in array, and the flip-chip LEDs 20 have a light emitting side 21 and an electrical connecting side 22. The electrical connecting side 22 of each flip-chip LED 20 has a p-contact pad 23 and an n pad 24, both of which are bump-shaped. The p-contact pad 23 is electrically connected to a positive electrode of the flip-chip LED 20, and the n-contact pad 24 is electrically connected with a negative electrode of the flip-chip LED 20. The positive and negative electrodes of each flip-chip LED 20 are wrapped by transparent encapsulant such as epoxy resin, while the p-contact pad 23 and the n-contact pad 24 are exposed from the encapsulant. Each flip-chip LED 20 can emit light from the light emitting side 21. To increase the manufacturing accuracy, the light emitting side 21 of the flip-chip LEDs 20 can be attached to a carrier 10 such as a hardboard. After the micro light emitting diode module is manufactured, the carrier 10 can be removed.

The dielectric layer 30 is formed on the electrical connecting side 22 of the flip-chip LEDs 20. The dielectric layer 30 can be made of photoimageable dielectric. The photoimageable dielectric is photosensitive to light within a certain wavelength range (such as ultraviolet). Photosensitizer (such as photosensitive polymers) of the photoimageable dielectric has photosensitive group which can react upon receiving light within a certain wavelength range. The photoimageable dielectric can be a positive photoimageable dielectric whose light-exposed area can be dissolved in developer. The photoimageable dielectric can also be a negative photoimageable dielectric whose non-exposed area can be dissolved in the developer.

By means of photolithography and development, the dielectric layer 30 can be formed with multiple electric channels 33, in which the electrical circuits 40 can be formed. The electrical circuits 40 each corresponds to one of the p-contact pads 23 and the n-contact pads 24. Each electrical circuit 40 directly contacts its corresponding p-contact pad 23 or n-contact pad 24 without conductive glue or solder paste sandwiched in between. The electrical circuit 40 is made of conductive material, such as copper.

In other possible embodiments, the dielectric layer can be made of non-photoimageable dielectric, and the electric channels can be formed in a laser engraving process.

Figure 12:
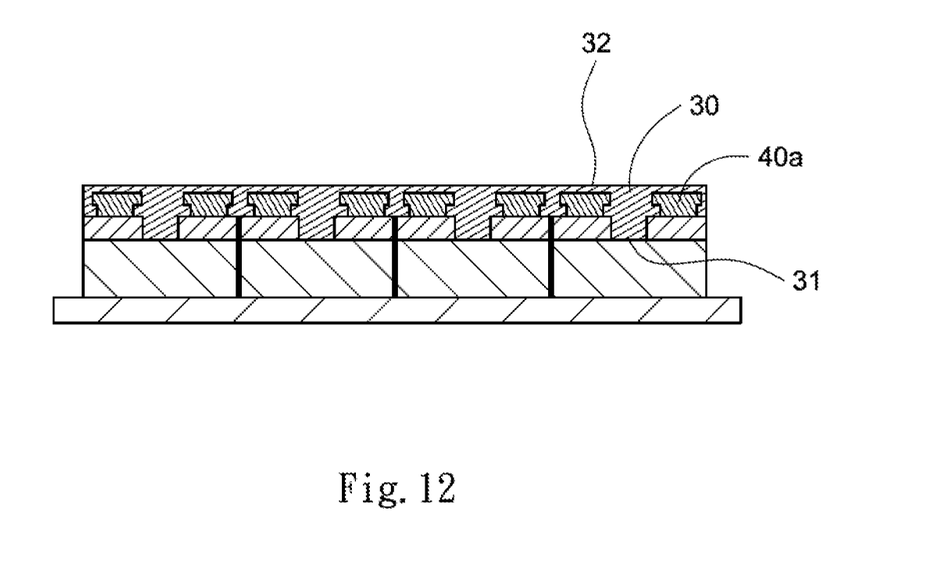

Referring to FIGS. 1 and 12, the dielectric layer 30 has a first side 31 facing the flip-chip LEDs 20 and has a second side 32 away from the flip-chip LEDs 20. A part of the electrical circuits 40 may be exposed from the second side 32 of the dielectric layer 30, and the solder mask layer 70 covers the part of the electrical circuits 40 and the second side 32 of the dielectric layer 30. The solder mask layer 70 and the dielectric layer 30 are both electrical insulators. It is to be noted that the electrical circuit 40 may further have electrical connecting pads, which are exposed from the solder mask layer 70, to be electrically connected to a driver integrated circuit chip. In other possible embodiments, the electrical circuits are encapsulated by the dielectric layer. Solder mask layer can be omitted.

Figure 2:
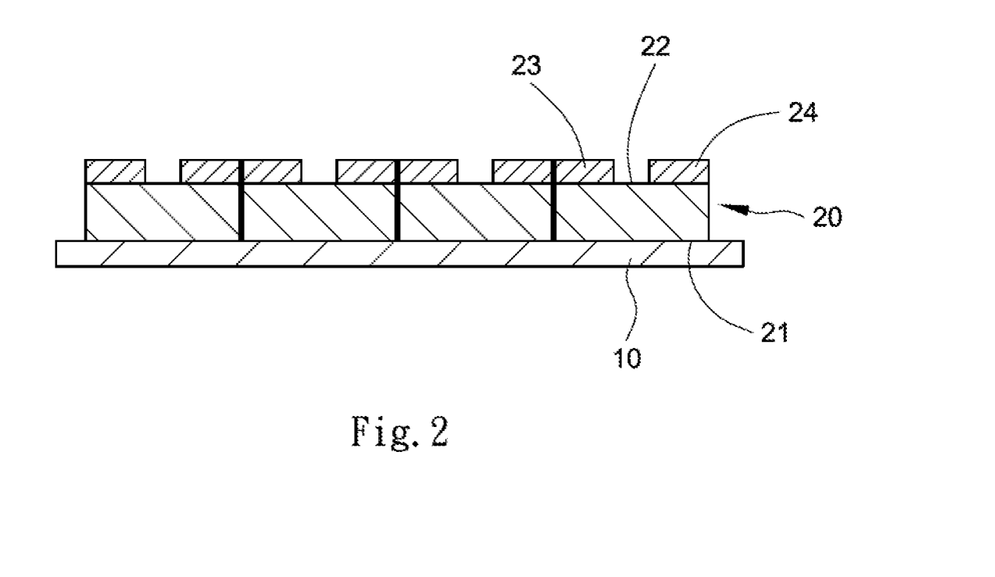
FIGS. 2-20 are cross sectional views showing steps of manufacturing the micro light emitting diode module according to an embodiment of the present invention.

FIGS. 2 to 20 illustrate the manufacturing process of a light emitting diode module, as discussed hereinafter:

Referring to FIG. 2, the light emitting side 21 of the flip-chip LEDs 20 are attached to a removable carrier 10 in a manner that the flip-chip LEDs 20 are arranged in array. The electrical connecting side 22, p-contact pads 23, and n-contact pads 24 of the flip-chip LEDs 20 face upward.

Figure 3:
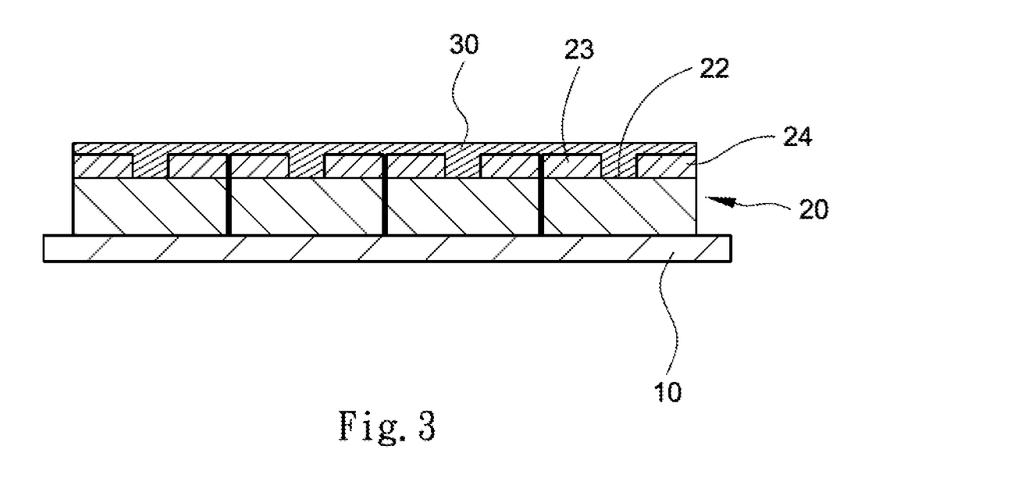

Referring to FIG. 3, the electrical connecting side 22 of the flip-chip LEDs 20 is formed with a bottom of the dielectric layer 30. Top surfaces of the p-contact pads 23 and the n-contact pads 24 are also covered by the dielectric layer 30. In this embodiment, the dielectric layer 30 is made of photoimageable dielectric.

Figure 4:
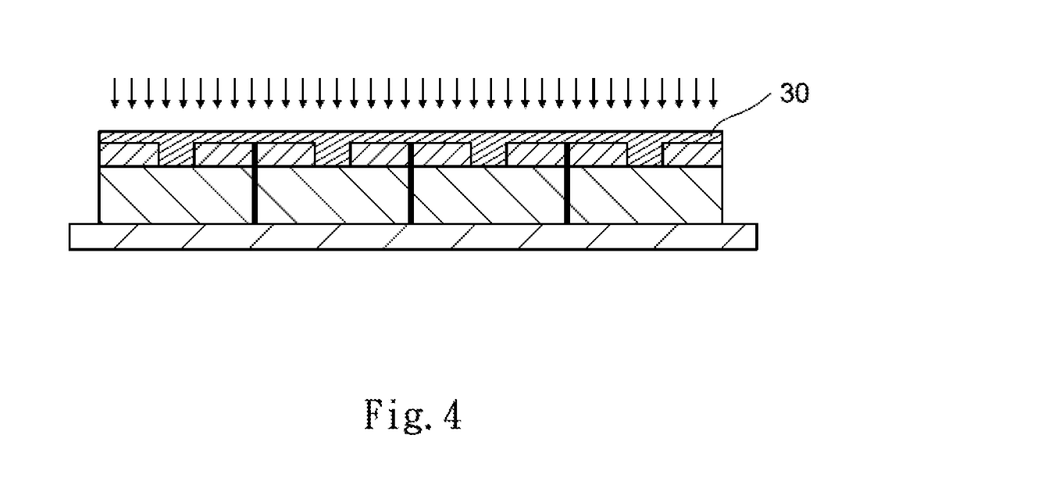

Referring to FIG. 4, the dielectric layer 30 is exposed to light, and patterns of a mask (not shown) are transferred to the dielectric layer 30. A part of the dielectric layer 30 is the exposed area, while the other part of the dielectric layer 30 is the unexposed area.

Figure 5:
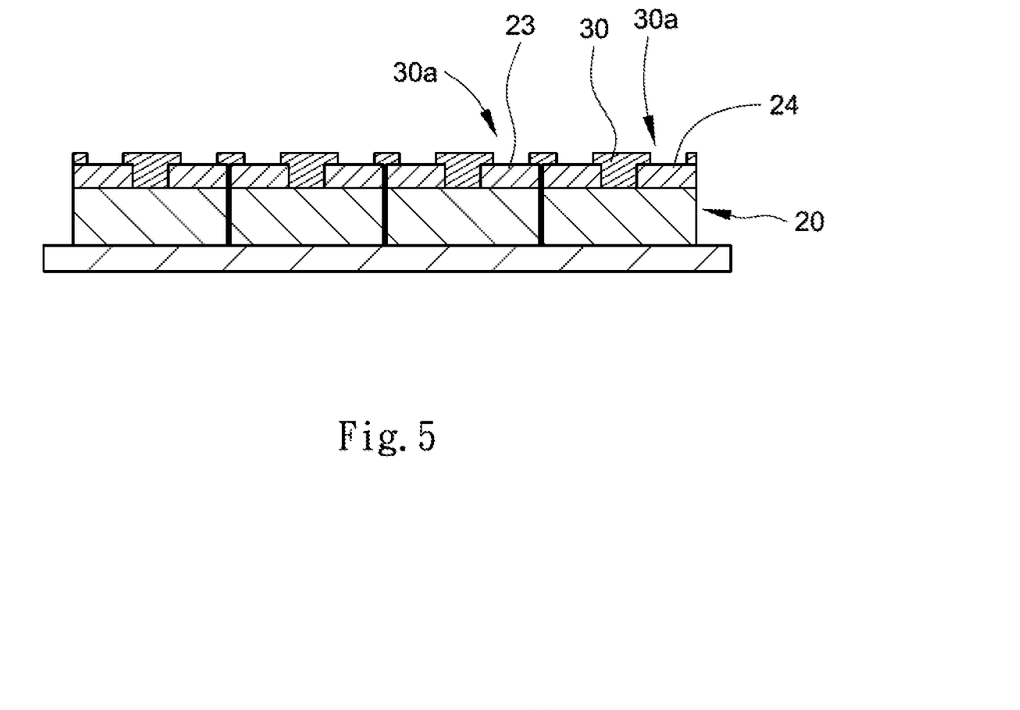

Referring to FIG. 5, a part of the dielectric layer 30 is removed by the developer. Multiple engraved patterns 30*a* are formed on the bottom of the dielectric layer 30. At least a part of the patterns 30*a* is corresponded to the p-contact pads 23 and the n-contact pads 24 of the flip-chip LEDs 20. The p-contact pads 23 and the n-contact pads 24 are thus exposed.

Figure 6:
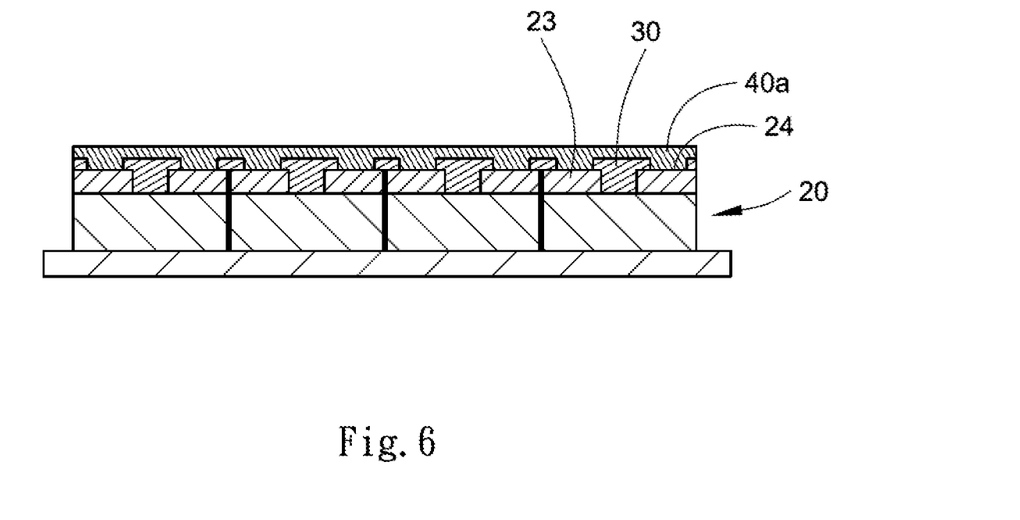
Figure 7:
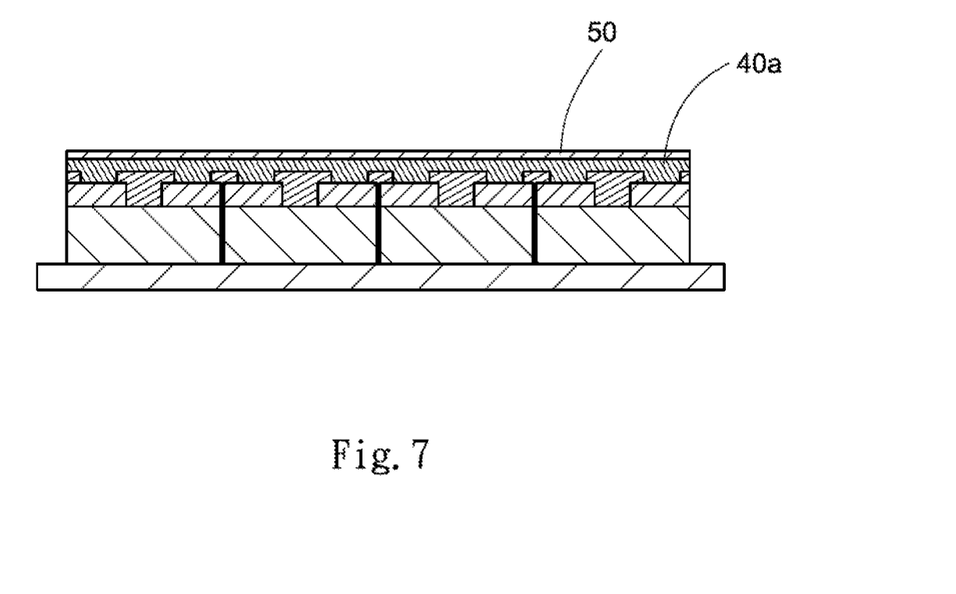
Figure 8:
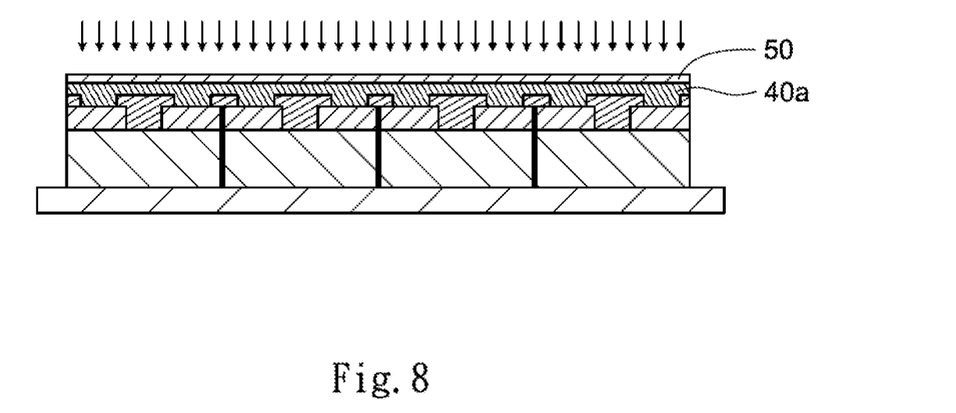
Figure 9:
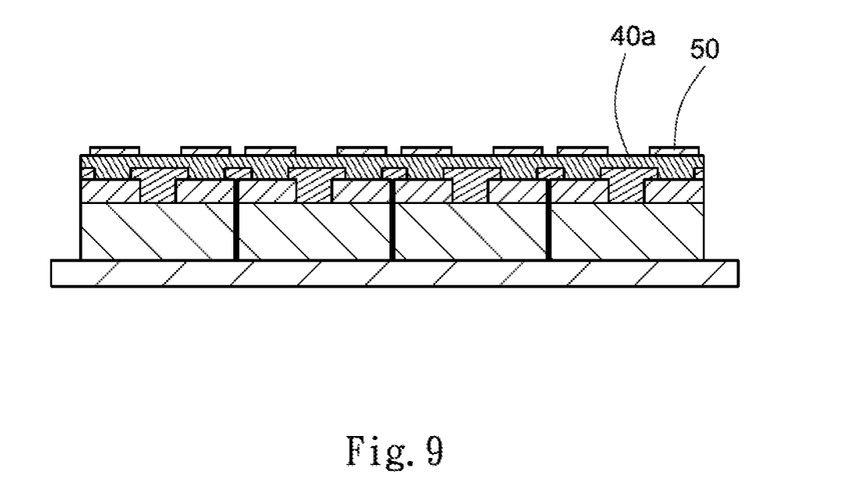
Figure 10:
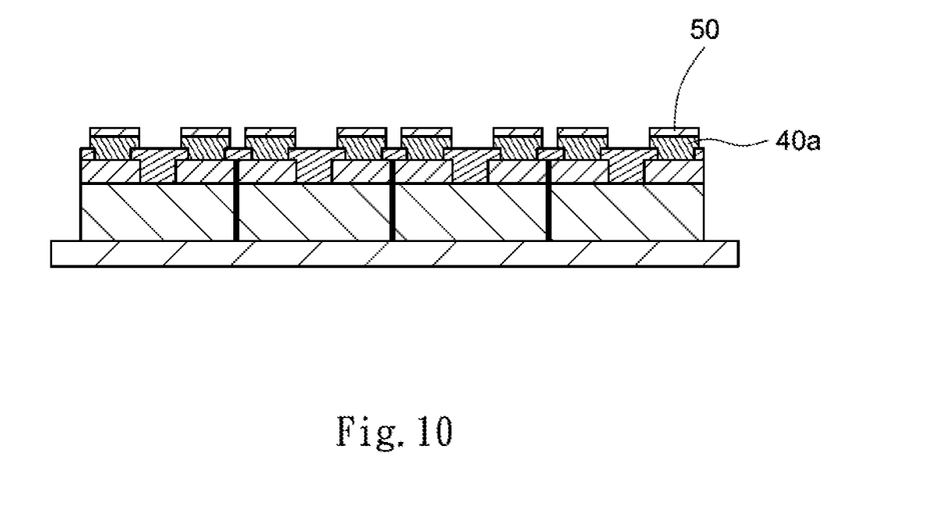
Figure 11:
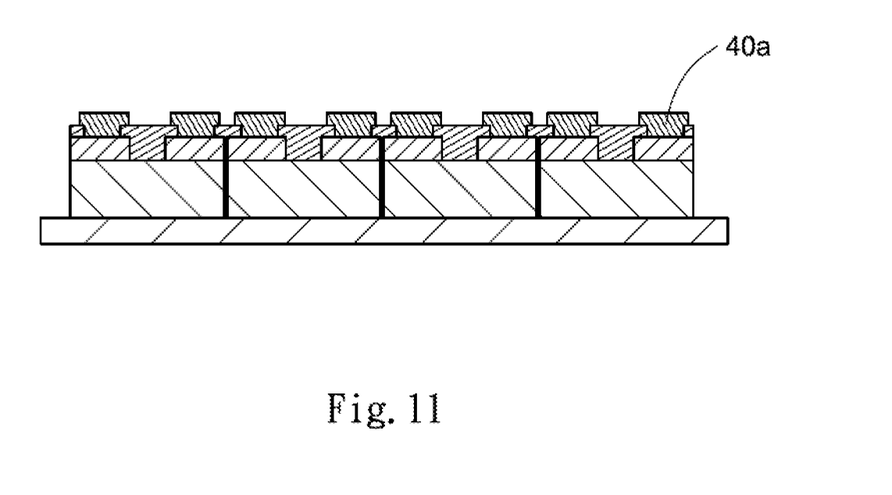

Referring to FIG. 6, a first copper plating layer 40*a* is formed atop the dielectric layer 30, the p-contact pads 23 and the n-contact pads 24 by means of an electroless copper plating process and/or a copper plating process. Referring further to FIG. 7, a photosensitive dry film 50 is formed atop the first copper plating layer 40*a*. As shown in FIG. 8, patterns of another mask (not shown) are transferred to the dry film 50 in an exposure process. Referring to FIG. 9, a part of the photosensitive dry film 50 is removed in a development process. Copper not covered by the dry film 50 is removed by etching solution as shown in FIG. 10. Thereafter, the dry film 50 is further removed, as illustrated in FIG. 11.

Figure 13:
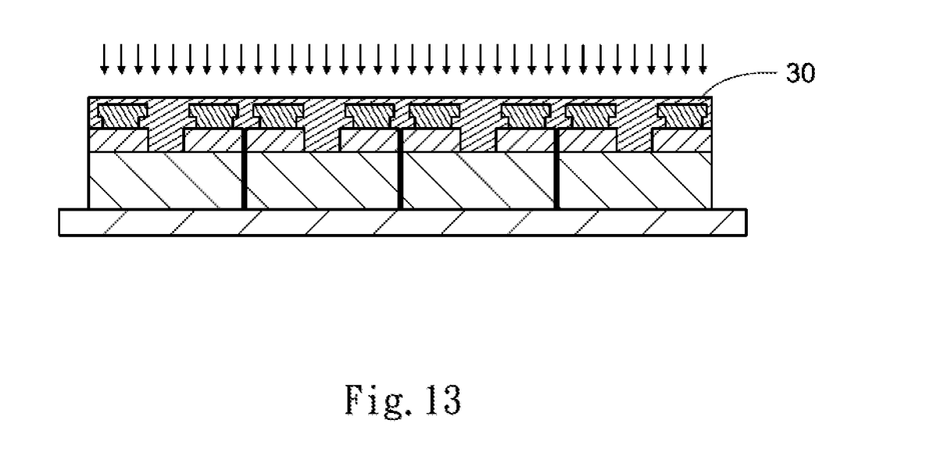
Figure 14:
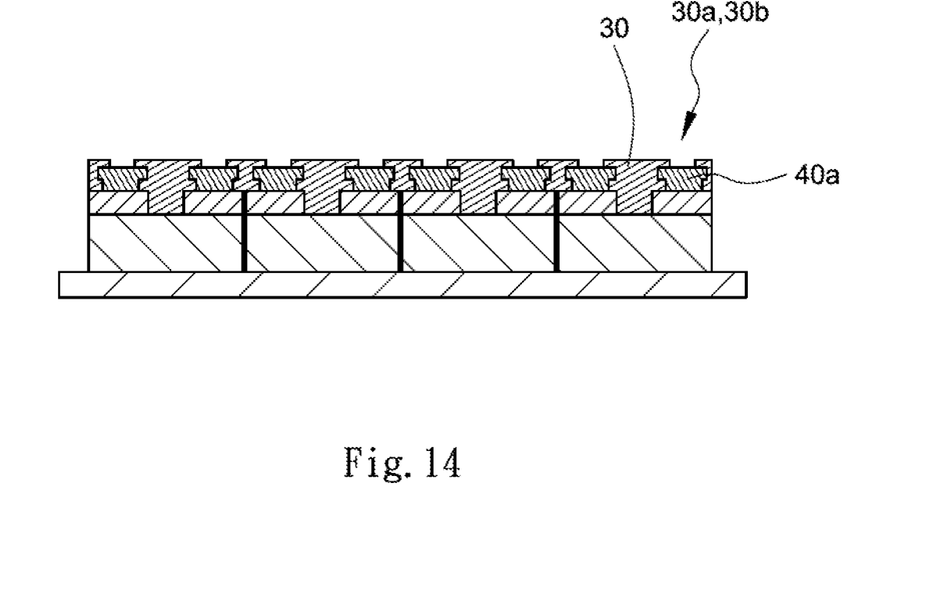
Figure 15:
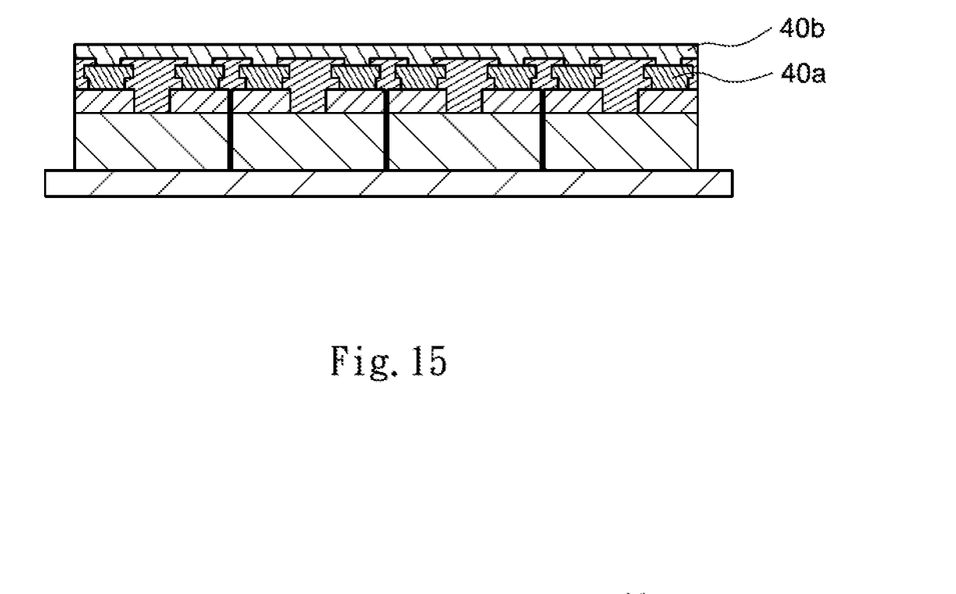
Figure 16:
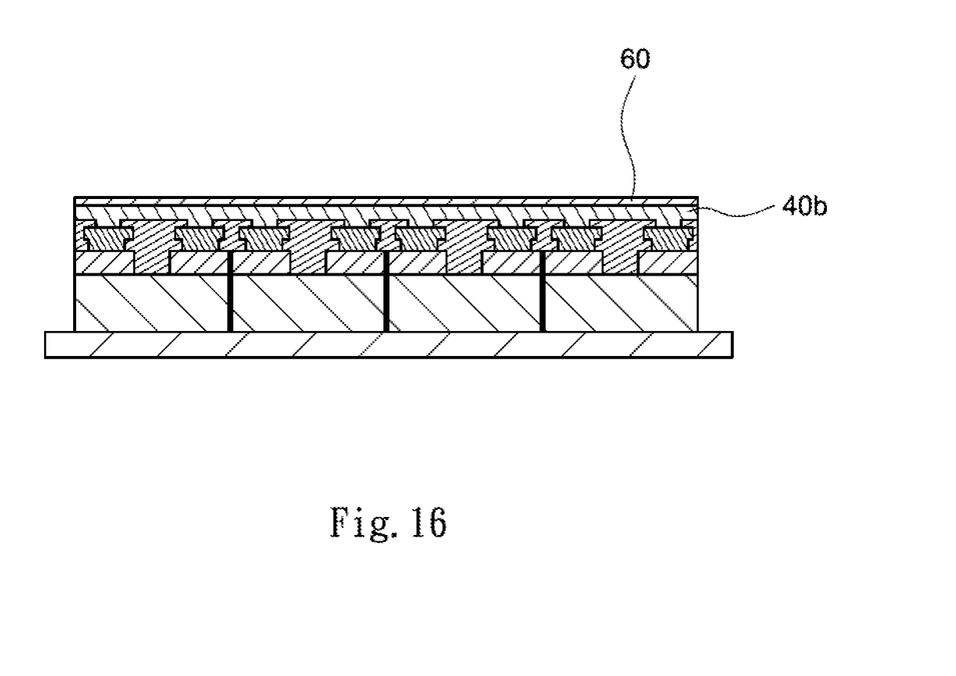
Figure 17:
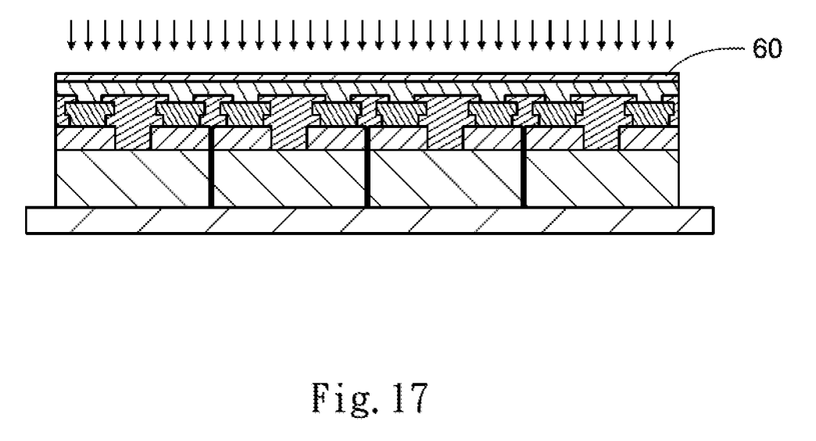
Figure 18:
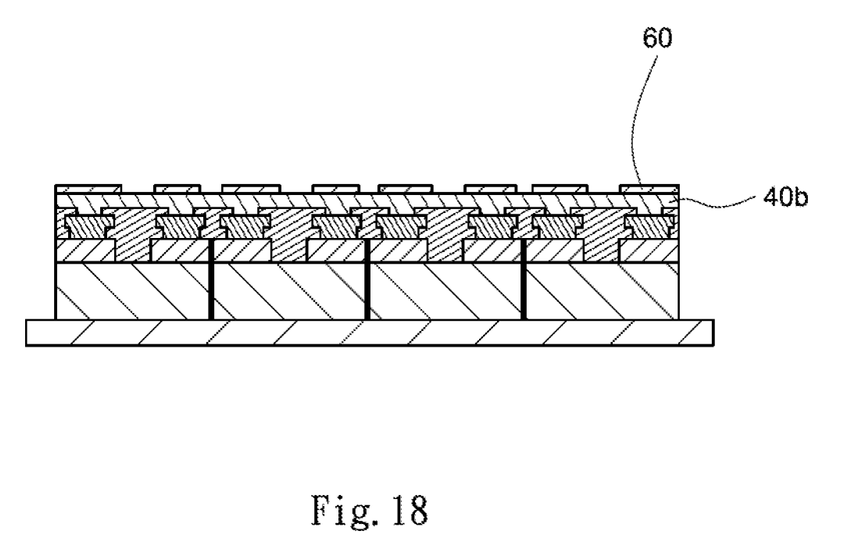
Figure 19:
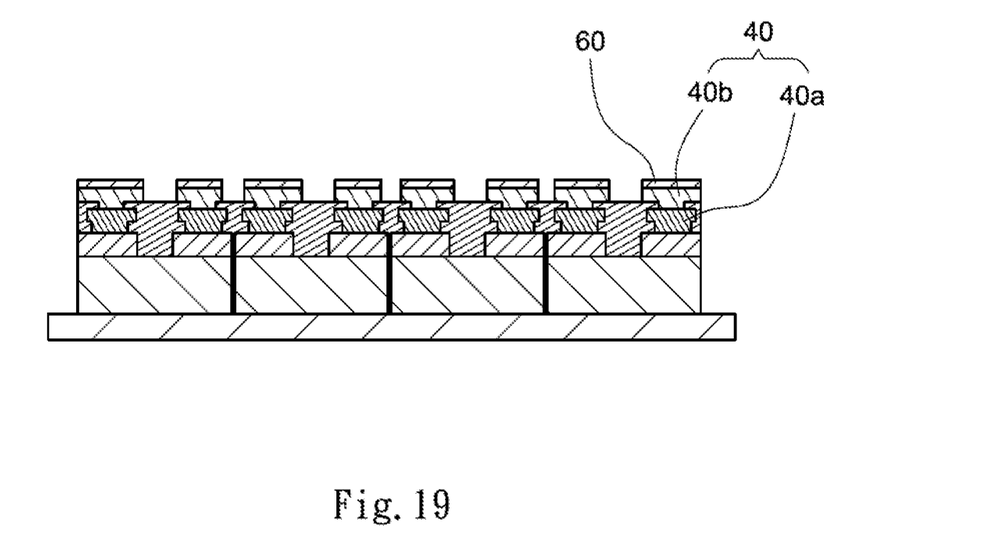
Figure 20:
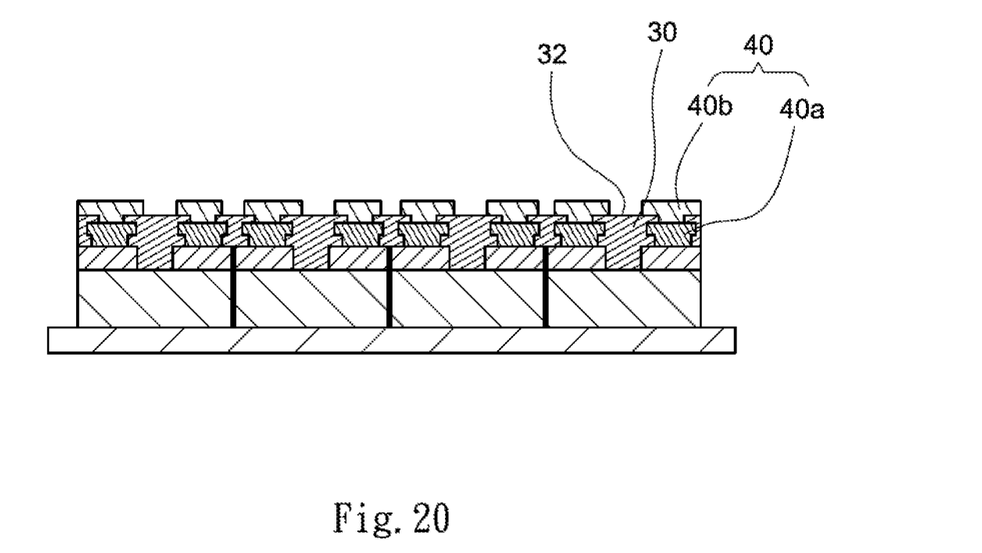
Figure 21:
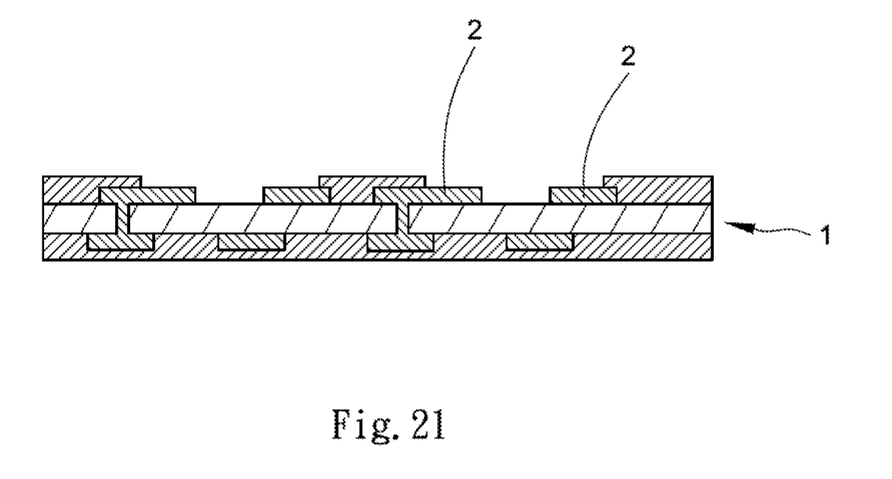
FIGS. 21-25 are cross sectional views showing steps of mass transfer of a conventional micro light emitting diode module.
Figure 22:
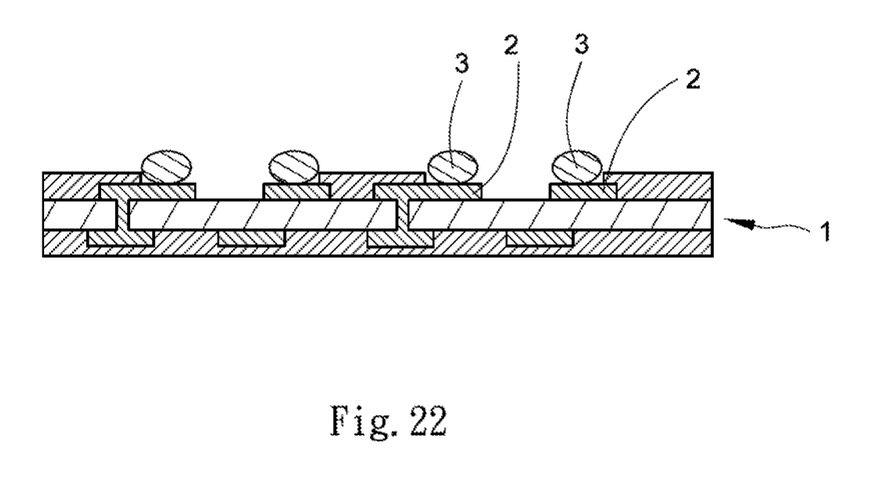
Figure 23:
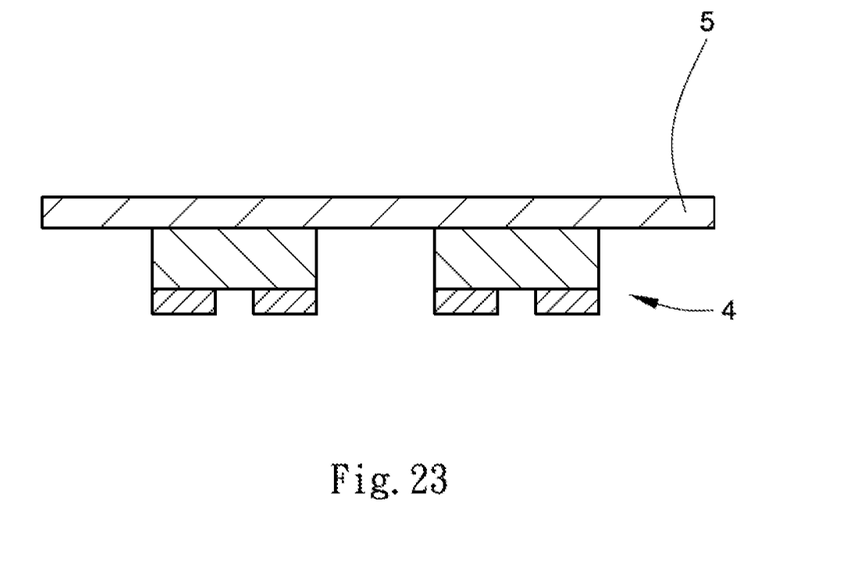
Figure 24:
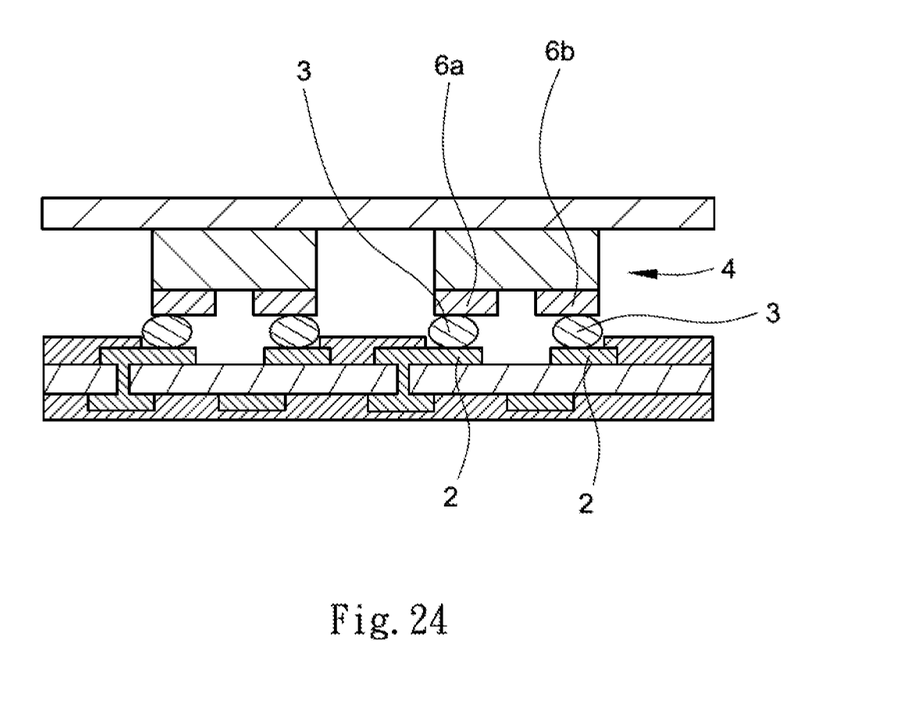
Figure 25:
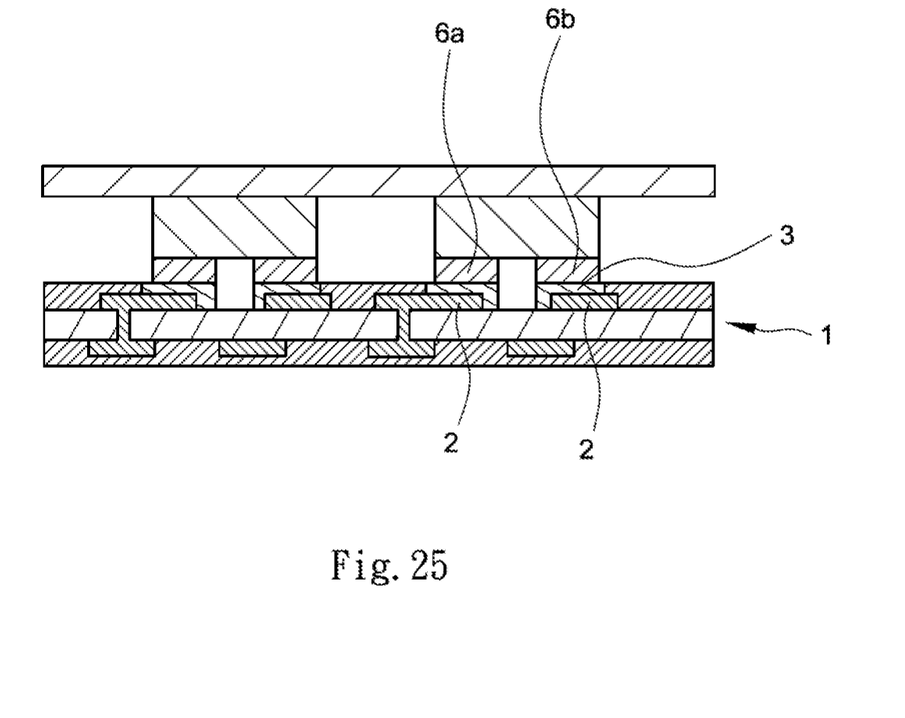

Referring to FIGS. 12-14, another part of the dielectric layer 30 is formed by means of a dielectric coating process, an exposure process and a development process. The engraved patterns 30*a*, 30*b* formed in different sublayers of the dielectric layer 30 are used as the electric channels 33 as shown in FIG. 1.

Referring to FIGS. 15-20, a second copper plating layer 40*b* is formed by means of copper plating, dry film 60 coating, exposure, development, etching and dry film 60 removing. The combination of the first copper plating layer 40*a* and the second copper plating layer 40*b* are the electrical circuits 40 as shown in FIG. 1. Thereafter, the solder mask layer 70 is formed on the electrical circuits 40 and the second side 32 of the dielectric layer 30. The micro light emitting diode module, as illustrated in FIG. 1, can thus be made. It is to be noted that the carrier 10 can be further removed after the aforesaid processes.

It is to be further noted that the dielectric layer and the electrical circuits can be formed in one or more laminations. In possible embodiments, the flip-chip LEDs are not equidistantly arranged. For instance, wiring channels can be preserved between some of the adjacent flip-chip LEDs 20.

What is claimed is:
1. A micro light emitting diode module comprising:
    multiple flip-chip LEDs arranged side by side, each of the flip-chip LEDs having a light emitting side and an electrical connecting side, the electrical connecting side of each flip-chip LED having a p-contact pad and an n-contact pad; and
    a dielectric layer formed on the electrical connecting side of the flip-chip LEDs, the dielectric layer having multiple electric channels in which multiple electrical circuits are formed, the multiple electrical circuits being corresponded to the p-contact pads and the n-contact pads of the flip-chip LEDs respectively, and each electrical circuit being electrically connected to its corresponding p-contact pad or n-contact pad, wherein the dielectric layer directly contacts the p-contact pads and the n-contact pads of the flip-chip LEDs;
    wherein the dielectric layer has a first side facing the flip-chip LEDs and a second side away from the flip-chip LEDs, the micro light emitting diode module further comprises a solder mask layer covering the second side of the dielectric layer;
    wherein a part of the electrical circuits is exposed from the second side of the dielectric layer, the part of the electrical circuits exposed from the second side of the dielectric layer has an outer surface facing opposite to the first side of the dielectric layer, and the solder mask layer fully covers the outer surface of the part of the electrical circuits exposed from the second side of the dielectric layer.

* * * * *